United States Patent
Kajita

(10) Patent No.: US 6,603,409 B2
(45) Date of Patent: Aug. 5, 2003

(54) DECODING APPARATUS AND DECODING METHOD OF REPEATED DATA FOR RATE MATCHING

(75) Inventor: Kuniyuki Kajita, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/959,423

(22) PCT Filed: Feb. 23, 2001

(86) PCT No.: PCT/JP01/01337

§ 371 (c)(1), (2), (4) Date: Oct. 26, 2001

(87) PCT Pub. No.: WO01/67618

PCT Pub. Date: Sep. 13, 2001

(65) Prior Publication Data

US 2002/0158780 A1 Oct. 31, 2002

(30) Foreign Application Priority Data

Mar. 6, 2000 (JP) ......................................... 2000-060051

(51) Int. Cl.$^7$ ......................... H03M 13/00; H03M 7/00
(52) U.S. Cl. ............................ 341/50; 341/94; 714/774
(58) Field of Search ........................... 341/50, 55, 81, 341/95, 94; 714/774

(56) References Cited

U.S. PATENT DOCUMENTS

| 5,657,325 | A  | * | 8/1997  | Lou et al. ................ 370/334 |
| 6,160,840 | A  | * | 12/2000 | Park ..................... 375/141 |
| 6,341,125 | B1 | * | 1/2002  | Hong et al. ............. 370/335 |
| 6,397,367 | B1 | * | 5/2002  | Park et al. .............. 375/265 |

FOREIGN PATENT DOCUMENTS

JP          2000004215       1/2000    .......... H03M/13/23

OTHER PUBLICATIONS

International Search Report dated May 22, 2001.
3rd Generation Partnership Project (3GPP);Technical Specification Group Radio Access Network Multiplexing and channel coding (FDD); 3G TS 25 212 V3.1.0(12–1999).

* cited by examiner

Primary Examiner—Peguy Jean Pierre
(74) Attorney, Agent, or Firm—Stevens, Davis, Miller & Mosher, LLP

(57) ABSTRACT

In a puncturing section 102, input memory 201 temporarily stores data inputted to the puncturing section 102, a controller 202 distinguishes data to be added, a switch 203 selects data to be added in accordance with control of the controller 202, an adder 204 adds data (namely, data subjected to repetition by a transmitter side) selected by the switch 203, and output memory 205 temporarily stores data outputted from the puncturing section 102.

7 Claims, 6 Drawing Sheets

TRANSMITTER SIDE | DATA AFTER ERROR CORRECTION CODING | {d1,d2,d3,d4,d5,d6,d7,d8}

REPETITION

DATA AFTER REPETITION | {d1,d1,d2,d3,d3,d4,d5,d5,d6,d7,d7,d8}

__:DATA SUBJECTED TO REPETITION

RECEIVER SIDE | DATA AFTER DEMODULATION | {d1,d1,d2,d3,d3,d4,d5,d5,d6,d7,d7,d8}

PUNCTURING  ADD d1,d3,d5,d7

DATA AFTER PUNCTURING | {d1+d1,d2,d3+d3,d4,d5+d5,d6,d7+d7,d8}

DECODING APPARATUS AND DECODING METHOD OF REPEATED DATA FOR RATE MATCHING

TECHNICAL FIELD

The present invention relates to a decoding apparatus and a decode processing method.

BACKGROUND ART

In a third-generation mobile radio communication system, rate matching processing is often carried out in coding or decoding received/transmitted data. The rate matching processing is processing in which a transmitter side increases or decreases the number of bits of data to adjust coded data to a frame length and a receiver side decreases the number of bits corresponding to the number of bits increased by the transmitter side, or increases the number of bits corresponding to the number of bits decreased by the transmitter side. In the explanation set forth below, processing for increasing the number of bits of data performed by the transmitter side refers to as "repetition" while processing for decreasing the number of bits of data performed by the receiver side refers to as "puncturing" with respect to repetition performed by the transmitter side.

The following will explain the state in which data subjected to repetition by the transmitter side is subjected to puncturing by the receiver side with reference to FIG. 1. FIG. 1 is a view illustrating a conventional puncturing method performed by the receiver side.

It is assumed that data sequence subjected to error correction coding is data sequence of 8 bits {d1, d2, d3, d4, d5, d6, d7, d8} in the transmitter side in the upper portion of FIG. 1. It is also assumed that the number of bits per one frame is 12 bits.

The transmitter side performs repetition such that an increase in energy in the frame after rate matching becomes even in accordance with a given algorithm. Accordingly, d1, d3, d5, and d7 are repeated respectively and a data sequence after the repetition results in {d1, d1, d2, d3, d3, d4, d5, d5, d6, d7, d7, d8} as illustrated in the upper portion of FIG. 1. From data sequence after the repetition, it is shown that arbitrary three continuous bits include two increased bits and one non-increased bit, resulting in the equal distribution of an energy increase in the data sequence.

On the other hand, the receiver side performs puncturing to data subjected to repetition by the transmitter side as illustrated in the lower portion of FIG. 1. Namely, if the data sequence demodulated by the receiver side includes {d1, d1, d2, d3, d3, d4, d5, d5, d6, d7, d7, d8} as illustrated in the lower portion of FIG. 1, the data sequence after puncturing results in {d1, d2, d3, d4, d5, d6, d7, d8}.

However, in the conventional puncturing method performed by the receiver side, as is obvious from the lower portion of FIG. 1, data subjected to repetition by the transmitter side (d1, d3, d5, and d7 in the example illustrated in FIG. 1) is discarded to perform puncturing.

DISCLOSURE OF INVENTION

It is an object of the present invention is to provide a decoding apparatus and a decode processing method capable of enhancing the effect of error correction decoding through the effective use of data, which is conventionally discarded, at the time of puncturing performed by a receiver side.

In order to attain the above object, according to the present invention, data subjected to repetition by a transmitter side is added without being discarded to increase likelihood of data at the time of puncturing performed by a receiver side, making it possible to enhance the effect of error correction decoding.

BEST MODE FOR CARRYING OUT THE INVENTION

Embodiments of the present invention will be specifically explained with reference to the drawings accompanying herewith.

(Embodiment 1)

Figure 1:
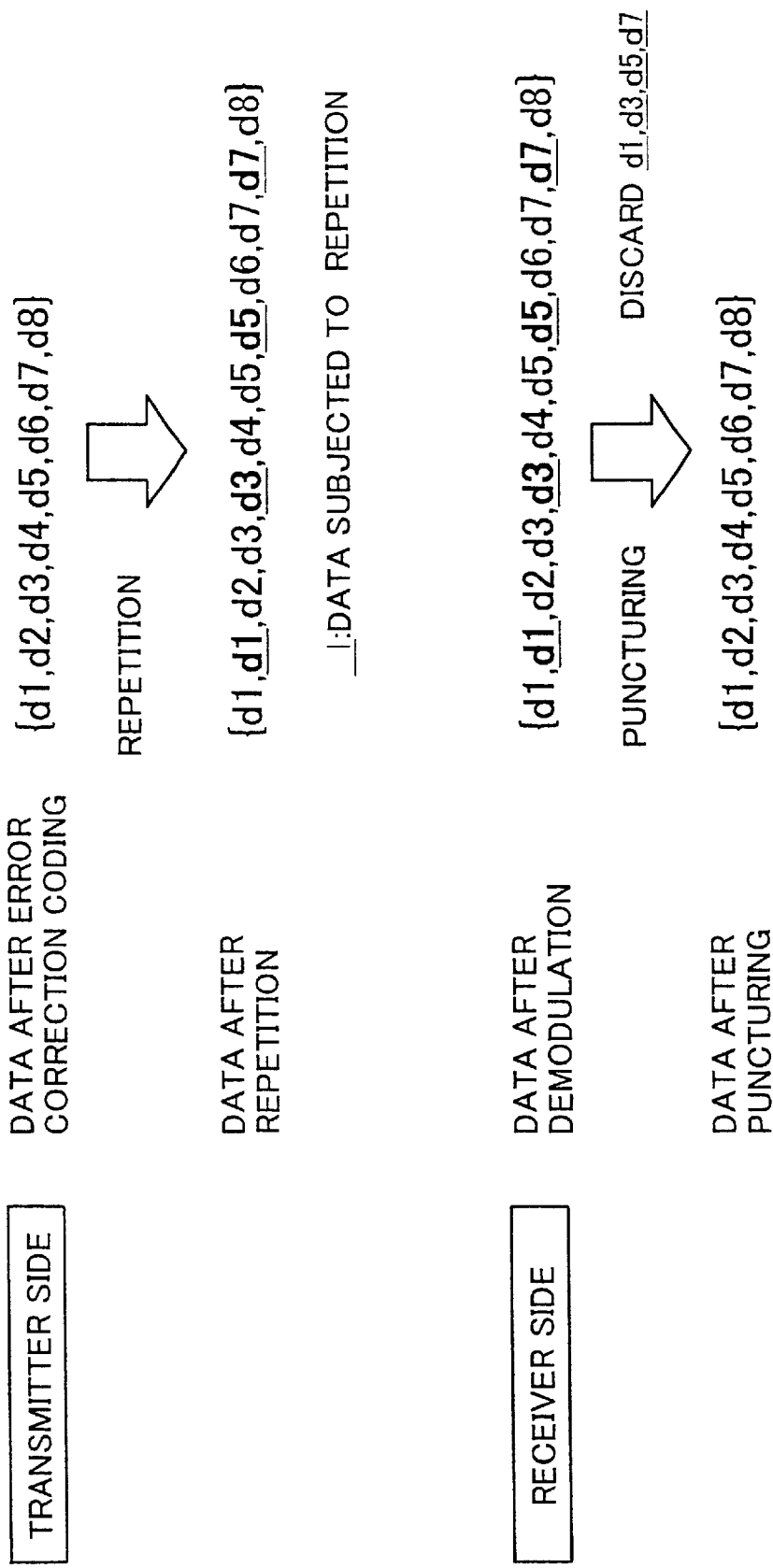
FIG. 1 is a view illustrating a conventional puncturing method performed by a receiver side.
Figure 2:
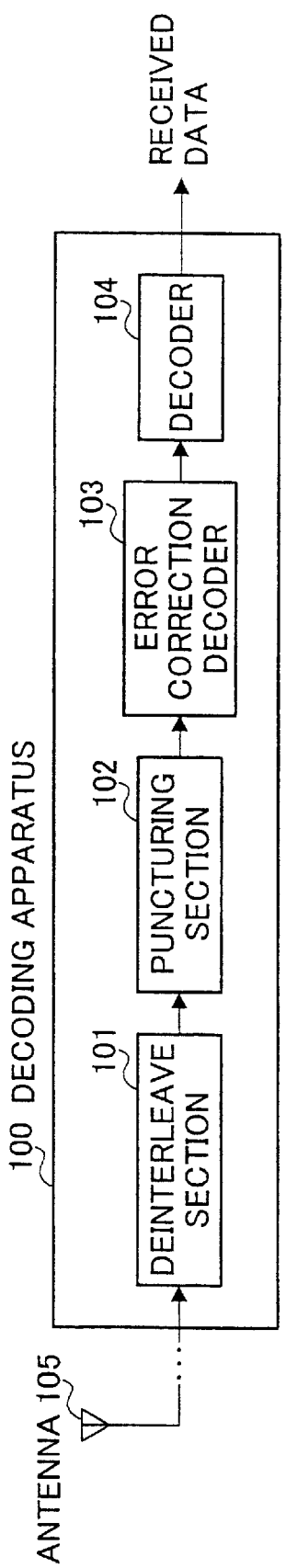
FIG. 2 is a general block diagram illustrating a schematic configuration of a decoding apparatus according to Embodiment 1 of the present invention.

FIG. 2 is a general block diagram illustrating a schematic configuration of a decoding apparatus according to Embodiment 1 of the present invention. As illustrated in FIG. 2, a decoding apparatus 100 includes a deinterleave section 101 that performs sorting, which is opposite to interleave performed by the transmitter side, a puncturing section 102 that performs puncturing to data subjected to repetition by the transmitter side, an error correction decoder 103 that performs error correction decoding using Viterbi coding, and a decoder 104 that performs error detection by CRC (Cyclic Redundancy Check) to obtain received data.

Figure 3:
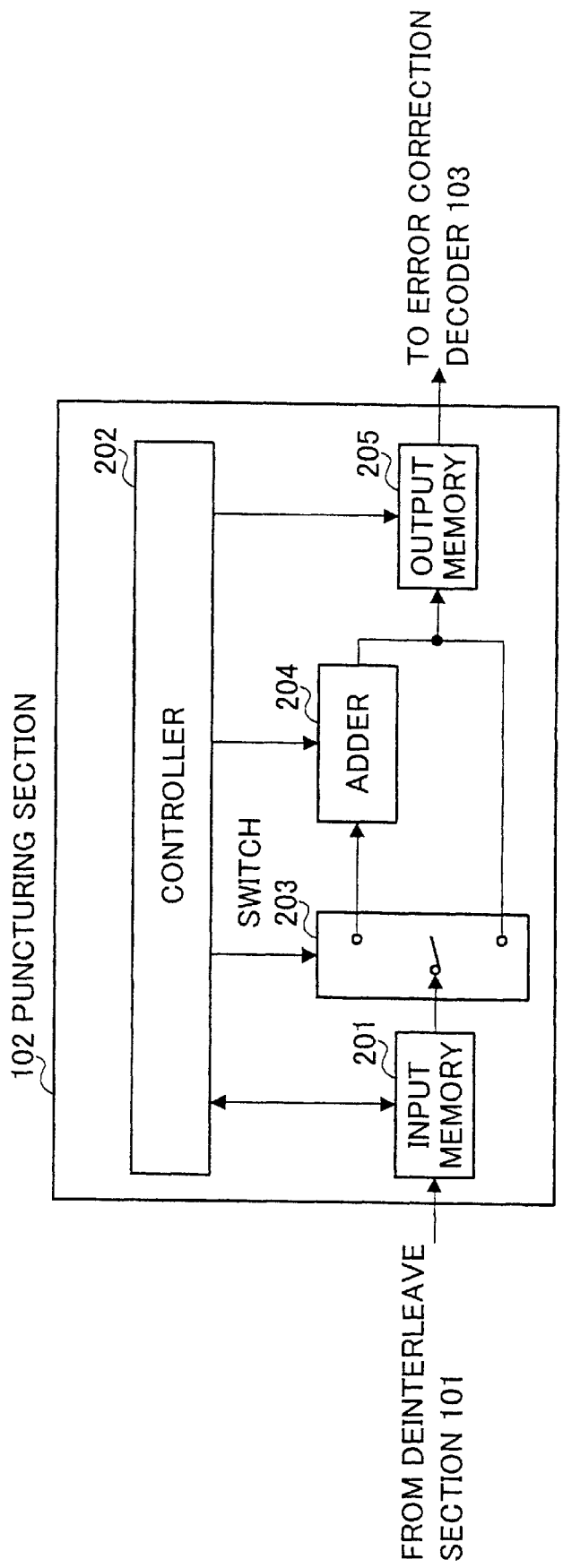
FIG. 3 is a general block diagram illustrating a schematic configuration of a puncturing section of the decoding apparatus according to Embodiment 1 of the present invention.

Moreover, the puncturing section 102 adopts the configuration of FIG. 3. FIG. 3 is a general block diagram illustrating the schematic configuration of the puncturing section of the decoding apparatus according to Embodiment 1 of the present invention.

As illustrated in FIG. 3, the puncturing section 102 includes input memory 201 for temporarily storing a data sequence inputted to the puncturing section 102, a controller 202 for distinguishing data to be added to control each configuration section, a switch 203 for selecting data to be added, an adder 204 for adding selected data (data subjected to repetition by the transmitter side), and output memory 205 for temporarily storing a data sequence to be outputted from the puncturing section 102.

Figure 4:
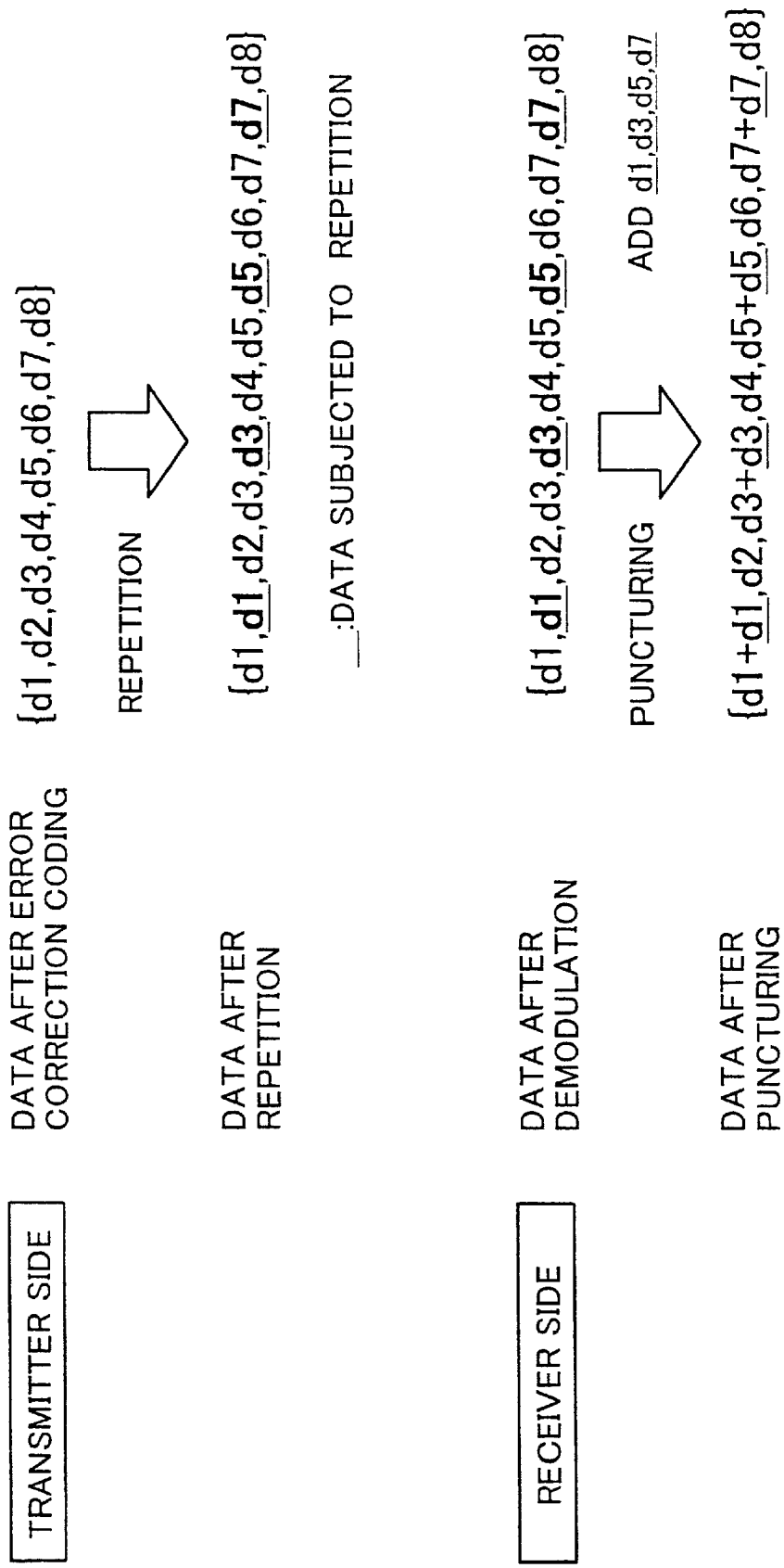
FIG. 4 is a view explaining the operation of puncturing that is performed by the decoding apparatus according to Embodiment 1 of the present invention.

An explanation will be next given of the operation of the decoding apparatus having the aforementioned configuration. FIG. 4 is a view explaining the operation of puncturing that is performed by the decoding apparatus according to Embodiment 1 of the present invention.

It is assumed that data sequence subjected to error correction coding is a data sequence of 8 bits {d1, d2, d3, d4, d5, d6, d7, d8} in the transmitter side as illustrated in the upper portion of FIG. 4. It is also assumed that the number of bits per one frame is 12 bits.

The transmitter side performs repetition in accordance with a given algorithm (for instance, an algorithm that performs repetition or puncturing such that an increase in energy in the frame becomes even as described in "3G TS 25 212 ver.3.1.0" of 3GPP, which is the third-generation standardization organization of mobile communication system). Here, it is assumed that d1, d3, d5, and d7 are subjected to repetition. The data sequence after the repetition results in {d1, d1, d2, d3, d3, d4, d5, d5, d6, d7, d7, d8} as illustrated in the upper portion of FIG. 4. The data sequence after the repetition is interleaved and the resultant data sequence is transmitted to a receiver having the decoding apparatus of this embodiment from the transmitter.

In the receiver, given radio processing, demodulation processing, and the like are provided to a signal received by an antenna 105 and the resultant signal is inputted to the decoding apparatus 100 in units of error correction decoding.

In the decoding apparatus 100, the deinterleave section 101 performs the sorting, which is opposite to interleave performed by the transmitter side, to demodulated data. As a result, the data sequence subjected to demodulation is illustrated as in the lower portion of FIG. 4. Then, the demodulated data sequence including {d1, d1, d2, d3, d3, d4, d5, d5, d6, d7, d7, d8} is inputted to the puncturing section 102.

In the puncturing section 102, the demodulated data sequence including {d1, d1, d2, d3, d3, d4, d5, d5, d6, d7, d7, d8} is once stored in input memory 201. Then, data is read in order from data d1 under control of the controller 202.

Moreover, the controller 202 distinguishes data to be subjected to puncturing among data stored in input memory 201 in accordance with the given algorithm which is the same as used in the transmitter side.

In the case of using the above algorithm, the controller 202 distinguishes that data d1, d3, d5, and d7 should be subjected to puncturing among the demodulated data sequence including {d1, d1, d2, d3, d3, d4, d5, d5, d6, d7, d7, d8}. Then, the controller 202 controls the switch 203 such that the input memory 201 and the adder 204 are connected to each other at the time of reading data d1 from the input memory 201. This inputs two data d1 (d1,d1) to the adder 204 sequentially.

At this time, the controller 202 outputs a signal, indicative of the number of data to be subjected to puncturing, to the adder 204. In other words, the controller 202 outputs a signal, which indicates the number of data to be added, to the adder 204. More specifically, the controller 202 controls the adder 204 to add adjacent data d1 (d1,d1) one time.

In accordance with this control, the adder 204 adds two data d1 (d1,d1) sequentially inputted, and outputs the resultant data to the output memory 205. This stores data d1+d1 in the output memory 205 as illustrated in the lower portion of FIG. 4. The same operation as the above is performed in connection with data d3, d5, d7.

While, the controller 202 distinguishes that data d2, d4, d6, and d8 do not have to be subjected to puncturing among the demodulated data sequence including {d1, d1, d2, d3, d3, d4, d5, d5, d6, d7, d7, d8}. Then, the controller 202 controls the switch 203 such that the input memory 201 and output memory 205 are directly connected to each other at the time of reading data d2, d4, d6, and d8 from the input memory 201. This inputs data d2, d4, d6, and d8 to the output memory 205 from the input memory 201 directly.

As a result of the above operation, the data sequence, which is subjected to puncturing and which is stored in the output memory 205, includes {d1+d1, d2, d3+d3, d4, d5+d5, d6, d7+d7, d8} as illustrated in the lower portion of FIG. 4. Namely, in connection with data d1, d3, d5, and d7, a value of each data is increased by the number of data repeated by the transmitter side, and the value of each data is doubled.

Then, the controller 202 reads the data sequence of {d1+d1, d2, d3+d3, d4, d5+d5, d6, d7+d7, d8} as one unit, namely, the data sequence after puncturing in units of error correction decoding, from the output memory 205, and outputs the data sequence to the error correction decoder 103. The error correction decoder 103 performs error correction decoding to this data sequence using, for example, Viterbi decoding, and the like.

Thus, according to the decoding apparatus and the decode processing method of this embodiment, data subjected to repetition by the transmitter side is added without being discarded to increase the value of data at the time of puncturing. This makes it possible to increase likelihood and to enhance the effect of error correction decoding. Accordingly, it is possible to improve the performance of decoding.

(Embodiment 2)

The decoding apparatus and the decode processing method of Embodiment 2 are different from those of Embodiment 1 in the point that added data is corrected when added data is overflowing.

Figure 5:
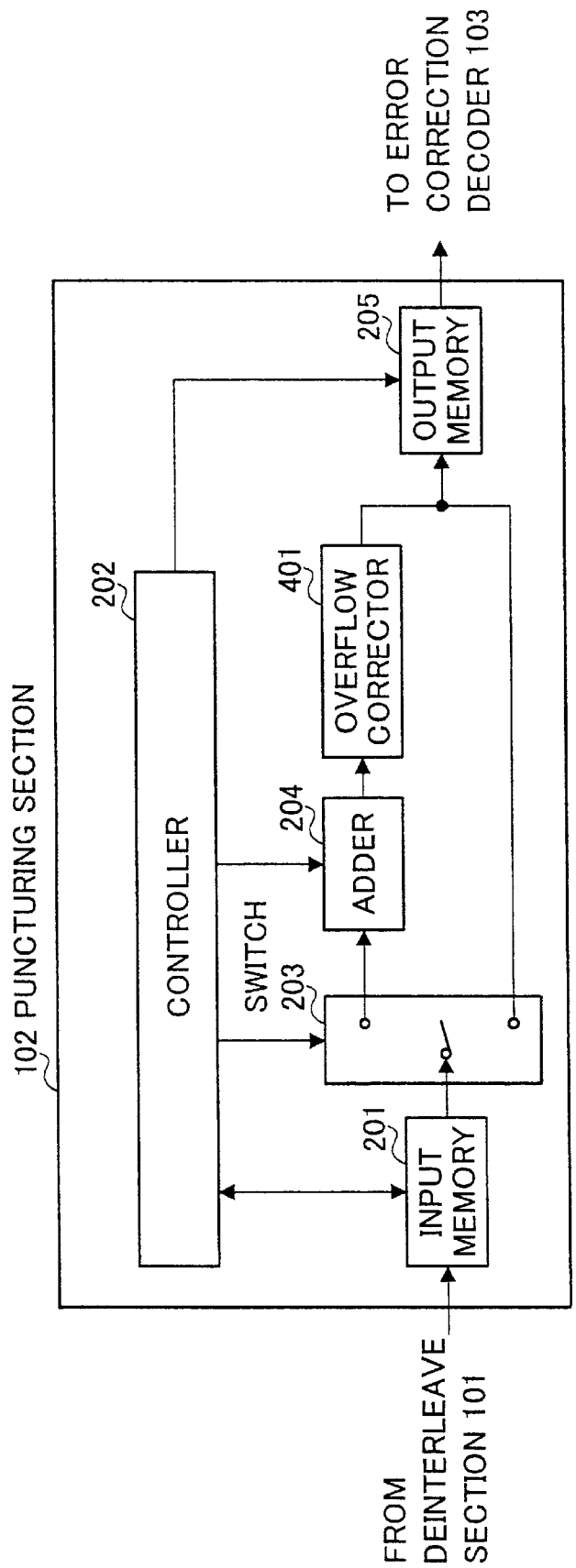
FIG. 5 is a general block diagram illustrating a schematic configuration of a puncturing section of the decoding apparatus according to Embodiment 2 of the present invention.

FIG. 5 is a general block diagram illustrating a schematic configuration of a puncturing section of the decoding apparatus according to Embodiment 2 of the present invention. In addition, the same reference numerals as Embodiment 1 are added to the same configurations as Embodiment 1, and the specific explanation is omitted.

As illustrated in FIG. 5, in addition to Embodiment 1, the puncturing section 102 includes an overflow corrector 401 that determines whether added data is overflowing and corrects added data when it is overflowing.

An explanation will be next given of the operation of the puncturing section 102 having the aforementioned configuration.

Since the allowable range of a data value with which the error correction decoder 103 can deal is predetermined, the data value added by the adder 204 exceeds the allowable range to cause overflow in some cases. Since the error correction decoder 103 cannot deal with the data value that exceeds the allowable range, and it cannot decode data that is overflowing.

For this reason, the overflow corrector 401 determines whether the data value of data added by the adder 204 (d1+d1, d3+d3, d5+d5, d7+d7 in the example illustrated in FIG. 4) is overflowing and provides correction processing to data in which an overflow occurs to fall within the allowable range.

More specifically, the determination and correction of the overflow are carried out in the following way:

Namely, in the overflow corrector 401, the allowable range (lower limit $D_L$ and upper limit $D_U$) of the data value with which the error correction decoder 103 can deal is preset. When data D (D=d1+d1, d3+d3, d5+d5, d7+d7 in the example illustrated in FIG. 4) outputted from the adder 204 is $D<D_L$ or $D_U<D$, the overflow corrector 401 determines that an overflow occurs in connection with data D.

Then, the overflow corrector 401 turns data D into $D_L$ when $D<D_L$, and turns data D into $D_U$ when $D_U<D$, thereby providing correction processing to data in which the overflow occurs.

Thus, according to the decoding apparatus and the decode processing method of this embodiment, it is possible to perform error correction decoding in the usual way since added data is corrected to prevent the occurrence of overflow of added data when added data is overflowing.

(Embodiment 3)

The decoding apparatus and the decode processing method of Embodiment 3 are different from those of Embodiment 1 in the point that all data values of received data is reduced by the same rate to prevent the occurrence of overflow of added data.

Figure 6:
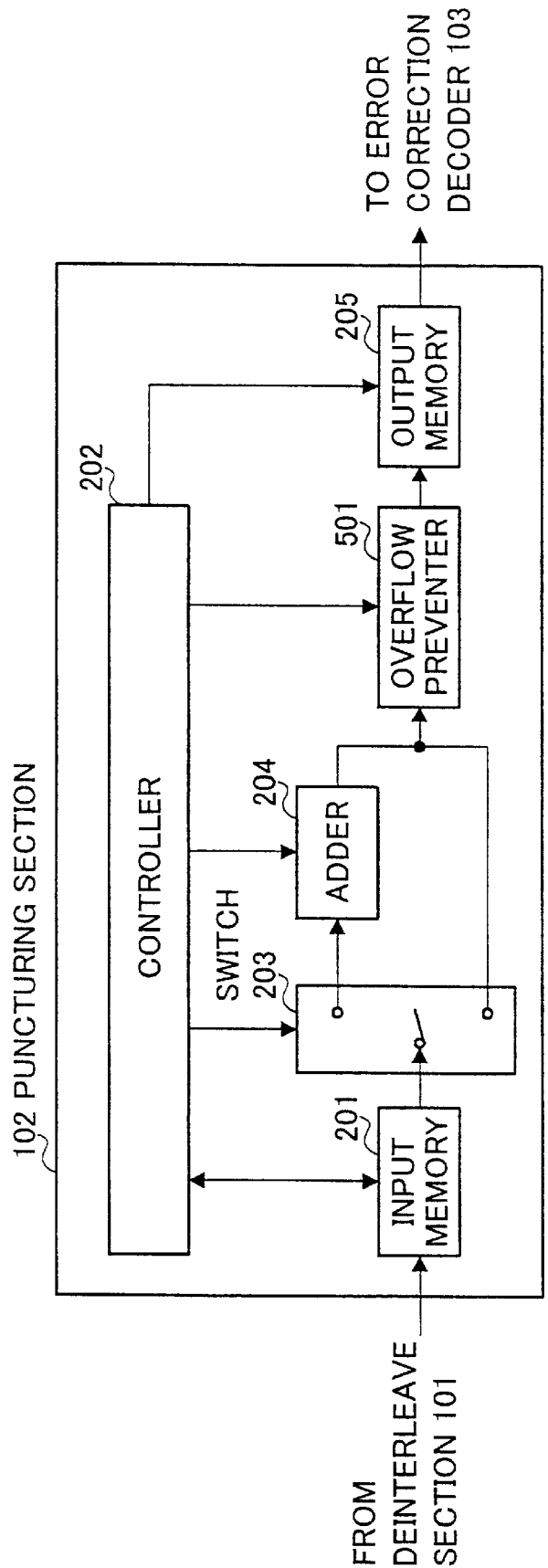
FIG. 6 is a general block diagram illustrating a schematic configuration of a puncturing section of the decoding apparatus according to Embodiment 3 of the present invention.

FIG. 6 is a general block diagram illustrating a schematic configuration of a puncturing section of the decoding apparatus according to Embodiment 3 of the present invention. In addition, the same reference numerals as Embodiment 1 are added to the same configurations as Embodiment 1, and the specific explanation is omitted.

As illustrated in FIG. 6, in addition to Embodiment 1, the puncturing section 102 includes an overflow preventer 501 that provides shift processing to all data to be inputted to make it possible to prevent the occurrence of overflow of added data.

An explanation will be next given of the operation of the puncturing section 102 having the aforementioned configuration.

Similar to Embodiment 2, since the allowable range of the data value with which the error correction decoder 103 can deal is predetermined, the data value added by the adder 204 exceeds the allowable range to cause overflow in some cases. Since the error correction decoder 103 cannot deal with the data value that exceeds the allowable range, and it cannot decode data that is overflowing.

For this reason, the overflow preventer 501 provides the same shift processing to all data d to be inputted (d=d1+d1, d2, d3+d3, d4, d5+d5, d6, d7+d7, d8 in the example illustrated in FIG. 4) so as to reduce the value of each data d by the same rate.

More specifically, shift processing is carried out in the following way:

Namely, it is assumed that the number of data, which is required to perform puncturing, is $N_P$. The overflow preventer 501 calculates a shift amount S in accordance with the following equation (1) to provide shift processing to all data to be inputted right by S bits.

$$S = \max\{Log_2(N_P)\} \text{ (round up the decimal places)} \quad (1)$$

Additionally, the number of data $N_P$, which is required to perform puncturing, is sent to the overflow preventer 501 from the controller 202.

Shift processing is performed in this way and the value of each data d is decreased by $\frac{1}{2}^S$ times to prevent the occurrence of overflow.

Thus, according to the decoding apparatus and the decode processing method of this embodiment, the data value of received data is reduced to prevent added data from overflowing, the overflow of added data does not occur to make it possible to perform error correction decoding correctly.

Moreover, according to the decoding apparatus and the decode processing method of this embodiment, since all data values of received data are reduced by the same rate, the ratio among the respective values among the respective data is unchanged. In other words, there is no such a case that information about the amount of data of small and large is lost. Accordingly, as compared with Embodiment 2, the effect of error correction decoding can be further improved as preventing added data from overflowing.

As explained above, according to the present invention, the effect of error correction decoding can be enhanced through the effective use of data, which is conventionally discarded, at the time of puncturing performed by a receiver side.

This application is based on the Japanese Patent Application No. 2000-060051 filed on Mar. 6, 2000, entire content of which is expressly incorporated by reference herein.

INDUSTRIAL APPLICABILITY

The decoding apparatuses according to Embodiments 1 to 3 can be applied to a mobile station apparatus and a base station apparatus, which are used in a mobile communication system.

What is claimed is:

1. A decoding apparatus, comprising:

a receiver that receives a data sequence, in which only a specific portion of the data sequence is subject to repetition at a transmitting side for rate matching;

a distinguisher that distinguishes the repeated data among the received data sequence;

an adder that adds the distinguished data and the specific portion of the received data sequence to produce added data that is used to increase a likelihood of correctly decoding the received data sequence;

a corrector that corrects the added data or all data in the received data sequence to produce corrected data that is within a range that can be decoded; and a decoder that performs error correction decoding to the corrected data and other data of the received data sequence.

2. The decoding apparatus according to claim 1, wherein said repeated data include multiple repeated data, said distinguisher distinguishes the multiple repeated data, and said adder adds (i) all of the multiple repeated data as said distinguished data and (ii) said specific portion of the received data sequence to produce said added data.

3. The decoding apparatus according to claim 1, wherein the corrector determines whether or not the added data is within the range that can be decoded by the decoder and corrects the added data when the added data cannot be decoded by the decoder.

4. The decoding apparatus according to claim 1, wherein the corrector reduces all values of data in the received data sequence through bit shift processing.

5. A mobile station apparatus comprising the decoding apparatus of claim 1.

6. A base station apparatus comprising the decoding apparatus of claim 1.

7. A decoding method, comprising the steps of:

receiving a data sequence, in which only a specific portion of the data sequence is subject to repetition at a transmitting side for rate matching;

distinguishing the repeated data among the received data sequence;

adding the distinguished data and the specific portion of the received data sequence to produce added data that is used to increase a likelihood of correctly decoding the received data sequence;

correcting the added data or all data in the received data sequence to produce corrected data that is within a range that can be decoded; and performing error correction decoding to the corrected data and other data of the received data sequence.

* * * * *